(12) United States Patent
Dutta

(10) Patent No.: US 9,991,407 B1
(45) Date of Patent: Jun. 5, 2018

(54) PROCESS FOR CREATING HIGH EFFICIENCY PHOTOVOLTAIC CELLS

(75) Inventor: Achyut Kumar Dutta, Sunnyvale, CA (US)

(73) Assignee: Banpil Photonics Inc., Santa Clara, CA (US)

( * ) Notice: Subject to any disclaimer, the term of this patent is extended or adjusted under 35 U.S.C. 154(b) by 0 days. days.

(21) Appl. No.: 12/821,125

(22) Filed: Jun. 22, 2010

(51) Int. Cl.
*H01L 31/072* (2012.01)
*H01L 31/0236* (2006.01)
*H01L 31/0352* (2006.01)

(52) U.S. Cl.
CPC ........ *H01L 31/072* (2013.01); *H01L 31/0236* (2013.01); *H01L 31/0352* (2013.01)

(58) Field of Classification Search
CPC ............... H01L 31/072; H01L 31/0236; H01L 31/0352
USPC ...... 438/22, 39, 42, 57, 93, 94, 61; 257/184, 257/E33.001, E33.003, E33.045, 79, 94, 257/E31.001, E31.032, E31.003, E31.037, 257/E31.038, E31.13, E27.122, E27.123, 257/E27.124, E27.125, E27.126
See application file for complete search history.

(56) References Cited

U.S. PATENT DOCUMENTS

| 4,322,571 | A | * | 3/1982 | Stanbery | 136/255 |
|---|---|---|---|---|---|
| 4,608,451 | A | * | 8/1986 | Landis | 136/256 |
| 4,626,613 | A | * | 12/1986 | Wenham et al. | 136/255 |
| 4,703,337 | A | * | 10/1987 | Yamazaki | 257/436 |
| 4,916,503 | A | * | 4/1990 | Uematsu et al. | 257/436 |
| 5,024,953 | A | * | 6/1991 | Uematsu et al. | 438/71 |
| 5,100,478 | A | * | 3/1992 | Kawabata | 136/249 |
| 5,378,289 | A | * | 1/1995 | Noguchi et al. | 136/258 |
| 5,441,577 | A | * | 8/1995 | Sasaki et al. | 136/244 |
| 5,449,626 | A | * | 9/1995 | Hezel | 438/71 |
| 5,704,992 | A | * | 1/1998 | Willeke et al. | 136/255 |
| 5,963,790 | A | * | 10/1999 | Matsuno et al. | 438/72 |
| 6,075,652 | A | * | 6/2000 | Ono et al. | 359/642 |
| 6,127,623 | A | * | 10/2000 | Nakamura et al. | 136/256 |
| 6,147,297 | A | * | 11/2000 | Wettling et al. | 136/256 |
| 6,210,991 | B1 | * | 4/2001 | Wenham et al. | 438/97 |
| 6,313,397 | B1 | * | 11/2001 | Washio et al. | 136/256 |
| 6,380,479 | B2 | * | 4/2002 | Nakai et al. | 136/246 |
| 6,645,833 | B2 | * | 11/2003 | Brendel | 438/458 |
| 6,803,250 | B1 | * | 10/2004 | Yaung et al. | 438/70 |
| 7,294,779 | B2 | * | 11/2007 | Watabe et al. | 136/256 |
| 8,027,086 | B2 | * | 9/2011 | Guo et al. | 359/485.05 |
| 8,124,437 | B2 | * | 2/2012 | Huang et al. | 438/58 |
| 2002/0084503 | A1 | * | 7/2002 | Lee et al. | 257/456 |
| 2004/0009629 | A1 | * | 1/2004 | Ahn et al. | 438/108 |
| 2004/0065362 | A1 | * | 4/2004 | Watabe et al. | 136/252 |

(Continued)

FOREIGN PATENT DOCUMENTS

JP 60022380 A * 2/1985 ............ H01L 31/04
KR 2009017760 A * 2/2009

(Continued)

*Primary Examiner* — Michele Fan

(57) ABSTRACT

A novel method to fabricate the high-efficiency solar cells are provided by this application. The cells are based on micro (or nano) structures that not only increase the surface area but also have the capability of self-concentrating the solar spectrum incident onto the cell. These photovoltaic cells have a larger power generation capability per unit physical area than conventional cells. These cells will have enormous applications in space, commercial, residential and industrial sectors.

6 Claims, 13 Drawing Sheets

(56) References Cited

U.S. PATENT DOCUMENTS

| | | | |
|---|---|---|---|
| 2004/0188381 A1* | 9/2004 | Sreenivasan | 216/40 |
| 2006/0275524 A1* | 12/2006 | Santen et al. | 425/385 |
| 2007/0057245 A1* | 3/2007 | Tavkhelidze et al. | 257/9 |
| 2007/0204902 A1* | 9/2007 | Dutta | 136/256 |
| 2008/0072958 A1* | 3/2008 | Dutta | 136/256 |
| 2008/0210950 A1* | 9/2008 | Sung | 257/77 |
| 2009/0165844 A1* | 7/2009 | Dutta | 136/255 |
| 2009/0179651 A1* | 7/2009 | Elgar et al. | 324/501 |
| 2009/0260685 A1* | 10/2009 | Lee et al. | 136/256 |
| 2010/0090341 A1* | 4/2010 | Wan et al. | 257/749 |
| 2010/0123885 A1* | 5/2010 | Kobrin | 355/53 |
| 2010/0247970 A1* | 9/2010 | Omatsu | 428/836 |
| 2010/0270263 A1* | 10/2010 | Li et al. | 216/41 |
| 2010/0270650 A1* | 10/2010 | Li et al. | 257/618 |
| 2010/0291728 A1* | 11/2010 | Huh et al. | 438/71 |
| 2010/0300518 A1* | 12/2010 | Moslehi et al. | 136/255 |
| 2010/0326522 A1* | 12/2010 | Okaniwa | 136/259 |
| 2011/0195141 A1* | 8/2011 | Muhammad et al. | 425/385 |
| 2012/0015470 A1* | 1/2012 | Nishimura et al. | 438/71 |

FOREIGN PATENT DOCUMENTS

| | | | | |
|---|---|---|---|---|
| KR | 2010130071 A | * | 12/2010 | |
| WO | WO 2009128946 A1 | * | 10/2009 | G03F 7/00 |

* cited by examiner

PROCESS FOR CREATING HIGH EFFICIENCY PHOTOVOLTAIC CELLS

STATEMENT REGARDING FEDERALLY SPONSORED RESEARCH OR DEVELOPMENT

This invention was made with Government support under contract no. W31P4Q-08-C-0057 awarded by US Army Aviation and Missile Command. The Government has certain rights in the invention.

CROSS-REFERENCE TO RELATED APPLICATIONS

Not Applicable

DESCRIPTION

Field of Inventions

This patent specification relates to the creation of structures of photovoltaic cells (hereafter also called "solar cells"). More specifically, it relates to creation of solar cells comprising structures for increasing the junction area and creating a self-amplifying and concentrating effect. This process is used to make solar cells for use in commercial, residential, space, and industrial applications for power generation.

Background of the Inventions

Photovoltaic cells, where light is converted into electric power, prevail in a wide range of application fields such as consumer electronics, industrial electronics, and space exploration. In consumer electronics, photovoltaic cells that consist of materials such as amorphous silicon are good choices for a variety of inexpensive and low power applications. Typical conversion efficiency, i.e. the solar cell conversion efficiency, of amorphous silicon based photovoltaic cells ranges from 6 to 8%. Although the fabrication processes of amorphous silicon based photovoltaic cells is rather simple and inexpensive, one notable downside of this type of cell is its vulnerability to defect-induced degradation that decreases its conversion efficiency.

For more demanding applications such as residential and industrial solar power generation systems, either poly-crystalline or single-crystalline silicon is the better choice because such applications have more stringent requirements of better reliability and higher efficiency than applications in consumer electronics. Photovoltaic cells consisting of poly-crystalline and single-crystalline silicon generally offer conversion efficiencies around ~15% and ~20%, respectively. As many concerns associated with a steep increase in the amount of the worldwide energy consumption are raised, further development in industrial solar power generation systems has become very important. However, due to the high cost ($3 to $5/Watt) of today's Si-based solar cell, the Si-solar cell is not yet widely accepted as an alternative source of energy.

Group II-VI compound semiconductors, like CdTe and CdS, have been investigated in the context of having industrial solar power generation systems manufactured at a lower cost, while maintaining a moderate conversion efficiency close to 15%, which is comparable to those of poly-crystalline silicon photovoltaic devises. However, the toxic nature of these materials is of great concern for the environment.

Group I-III-VI compound semiconductors, such as CuInGaSe$_2$, have been also extensively investigated for industrial solar power generation systems. These materials may maintain a conversion efficiency around ~19%. This is comparable to that of single crystalline based cells. The materials mentioned above also have the potential of being synthesized at a much lower cost than their counterpart, single crystalline silicon. So far this conversion efficiency can only be achieved through combination with the toxic group II-VI compound semiconductor cells [Contreras M A, Egaas B, Ramanathan K, Hiltner I, Swartzlander A, Hasoon F, Noufi R. *Progress toward 20% efficiency in Cu(In,Ga)Se polycrystalline thin-film solar cell. Progress in Photovoltaics: Research and Applications* 7999; 7: 311-316.]. This again raises issues associated with the toxicity of these materials and their threat to the environment.

Another type of photovoltaic cell is designed for several exclusive applications, including use in space, where high conversion efficiency, and not cost, is the main consideration. Generally, this solar cell consists of group III-V semiconductors including GaInP and GaAs. The synthesis processes of single crystalline group III-V is, in general, very costly because of substantial complications involved in epitaxial growth of group III-V single crystalline compound semiconductors. These cells are intended to be group III-V compound semiconductor based cells. The typical conversion efficiency of these photovoltaic cells when combined with expensive germanium substrates can be as high as ~34%, usually more than 10 times than the conventional Si-solar cell.

All types of photovoltaic cells described above, no matter what materials the cell is made of, essentially fall into one specific type of structure that usually limits its power generation capability. Usually, a flat pn-junction structure is used in conventional solar cells. FIG. 1A, prior art, is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generates electron-hole pairs 150e and 105h, 106e and 106h after being absorbed by the p and also n-type semiconductor layers 101 and 102. The incident light generates electrons 105e and also holes 105h in the region near the pn-junction 103 and also electrons 106e and holes 106h in the region far from the pn-junction 103. The photo generated electrons 105e and 106e and holes 105h and 106h (hereafter considering only electronics, i.e. minority carriers in p-type semiconductors; the same explanation is applicable for holes, minority carriers in n-type semiconductors) diffusing toward the pn-junction 103 and entering the pn-junction 103 contribute to photovoltaic effect. The two key factors that substantially impact the conversion efficiency of this type of photovoltaic cell are photo carrier generation efficiency (PCGE) and photo carrier collection efficiency (PCCE).

The PCGE is the percentage of the number of photons entering a cell and contributing to the generation of photo carriers. The PCGE, ideally, needs to be as close to 100% as possible. On the other hand, the PCCE is the percentage of the number of photo-generated electrons (FIG. 1) 105e and 106e reaching the pn-junction 103 and contributing to the generation of photocurrent. For monochromatic light, a PCGE of ~100% can be achieved by simply making the p-type layer 101 thicker. However, if the p-type layer 101 is too thick, electrons 106e generated at the region far away from the pn-junction 103 cannot be collected efficiently due to many adverse recombination processes that prevent photo generated carriers from diffusing into the pn-junction 103, significantly decreasing PCCE. Thus, the basic structure of current photovoltaic cells severely limits increasing the conversion efficiency.

Usually, by using a thicker and high quality wafer, the conversion efficiency of conventional solar cell can be increased to the extent mentioned earlier. However, this makes the solar cell heavier and more costly.

In addition to increasing the collection efficiency, absorption of a broad solar spectrum also increases the conversion efficiency.

Furthermore, increasing the intensity of the solar spectrum helps to increase the conversion efficiency, thereby increasing the power generation capacity. Conventionally, a concentrator is used separately from a solar cell to increase the conversion efficiency. This requires an additional component with the solar cell to concentrate the solar spectrum and increases the cost.

It is highly desirable to have a solar cell structure having (a) a high PCCE that is independent of the substrate thickness, (b) the ability to absorb a broad solar spectrum, and (c) a self concentrating capability to increase the intensity of solar spectrum incident per unit area.

FIG. 1B shows typical monochromatic light intensity behavior inside the semiconductor. The light intensity p at certain depth x is expressed as $p(x)=P_o \exp(-\alpha x)$, where $P_o$ is the peak intensity at the surface and $\alpha$ is the absorption co-efficient of the semiconductor in which light is entering. As shown in FIG. 1B, the light intensity behavior 108 inside the bulk semiconductor is exponential. Carriers (not shown here) generated due to light flux 112 absorbed by pn-junction are only drifted by the junction field and can be collected efficiently. Whereas, carriers 106e and 106h (see FIG. 1A) generated due to absorption of light-flux 110 by semiconductor region 101 (FIG. 1B) are diffused in all directions. Only those that are generated closer (distance equal to or less than the diffusion-length of the semiconductor) to the pn-junction, can be collected. Those carriers that are generated farther away (distance longer than the diffusion-length of the semiconductor) from pn-junction are recombined and lost. The light flux 112 is usually lost either by going out or by being absorbed by the substrate.

Both PCGE and PCCE are mainly dependent on materials and the structure of the photovoltaic cells. Today's photovoltaic cells are structured in such a way that (a) wide ranges of solar spectrum cannot be absorbed due to the cell's material limitation, and (b) photo carrier's collection efficiency is lower due to the cell's inherent structure. For example, the typical conversion efficiency of today's crystal-Si based solar cell is ~18%. Wavelengths of the solar spectrum range from <0.1 to 3.5 µm in which Si can only absorb ~0.4 to 0.9 µm of light. ~50% of light belonging to the solar spectrum cannot be absorbed by Si, because of its inherent material properties. The rest of 32% is lost due to (i) recombination of photo-generated carriers and (ii) loss of light 112 which is shown in FIG. 1B. These two factors are structure dependent. If we could reduce these two factors, ~50% conversion efficiency can be achieved even in Si-based solar cells. If we could capture different wavelengths of light belonging to the solar spectrum by utilizing different material systems or nano-material systems, we could ideally increase the conversion efficiency close to 100%. Furthermore, if the solar cell (photovoltaic cell) detection capability can be extended to the infrared-spectrum, then the cell can produce electrical energy not only during day (while sun is present), but also at night (when different infrared light is present). In addition, today's solar cell materials are not highly radiation-tolerant. In space applications especially, photovoltaic cells should have structures and material systems that can generate high-power per unit area and have high radiation tolerance.

To increase the conversion efficiency significantly, it would be desirable to have photovoltaic cell structures which have: (a) a larger surface area to volume ratio to capture all the photons (at specific wavelengths) entering the cell and a pn-junction that is located as close to the photo absorption region as possible, (b) amplifying capabilities by concentrating the light incident to its surface, and (c) a structure comprised of material systems having photo responses at different wavelengths to efficiently cover a wide range of the spectrum of light that enters a photovoltaic cell. It would be further desirable to have solar cells that could generate electric power in both day and night.

BRIEF SUMMARY OF THE INVENTION

Accordingly, it is an object of the invention to provide an inexpensive way to manufacture solar cells, that have high power generation capability per unit area over conventional counterparts, mentioned as the prior arts.

According to this invention, it is an object to manufacture a solar cell structure having self-concentrating capabilities that amplify the solar spectrum incident onto its surface.

According to this invention, it is an object to provide the solar cell structure to reduce the carriers-recombination and also to increase the absorption of the light by increasing the effective junction area, which increases the photo-generated carriers.

According to this invention, it is an object to increase the absorption bandwidth of solar spectrum to increase the conversion efficiency.

It is an object to provide solar cell structures by increasing the surface area to increase the incident light intensity per unit its base area.

It is an object to provide various solar cell structures based on trapezoidal, pyramid, cone, cylindrical, or any other suitable shape, to increase the ratio of junction area to the volume. This would increase the conversion efficiency of the cell.

It is also an object of this invention to form a structure that serves as a mold in the creation of a solar cell.

It is also an object to form the structure made from electronics materials on which semiconductor p-n, Schottky, or metal-insulator-semiconductor (MIS) junction is formed. The electronic materials can be formed on the base substrate like Si, Ge, metal-foil, or glass to make them lower-cost.

It is also another object of this invention to provide the structures of the photovoltaic cells that can capture most of the wavelengths belonging to solar spectrum and can provide >80% conversion efficiency.

It is also another object of this invention to provide the structures of the photovoltaic cells that can generate electric power in both day and night.

It is also another object of this invention to provide a low-cost manufacturing process for the photovoltaic cell.

This invention offers to achieve ideally >50% conversion efficiency utilizing Si— materials and >80% conversion efficiency for other materials. The main advantage of these inventions is that today's matured process technologies are used to fabricate the photovoltaic cell that has a power generation capability above and beyond that of conventional photovoltaic cells.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein.

DETAILED DESCRIPTION

The following described process is a manufacturing sequence that results in a solar cell with a patterned structure designed to self intensify the light that is incident on the surface of the cell. These shapes are myriad and depend on the incident light to be captured and how it alters its angle with respect to the surface. Some examples of suitable shapes are a trapezoidal pyramid, a pyramid, and a cylinder. These shapes are given as examples and are not to be considered limiting of the type of structures that can be made. There are several processes that produce several structures with the same intensifying effects. These processes are described in detail in the following paragraphs.

Each process requires the construction of a mold that imprints the pattern on the final surface. According to our invention, the mold is made from one of two processes. One method involves creating a plug or buck that is shaped like the desired pattern, and then the final mold is created from this pattern. The other method creates the final mold without another molding process. Both of these molding processes are discussed below.

Figures 1A, 1B:
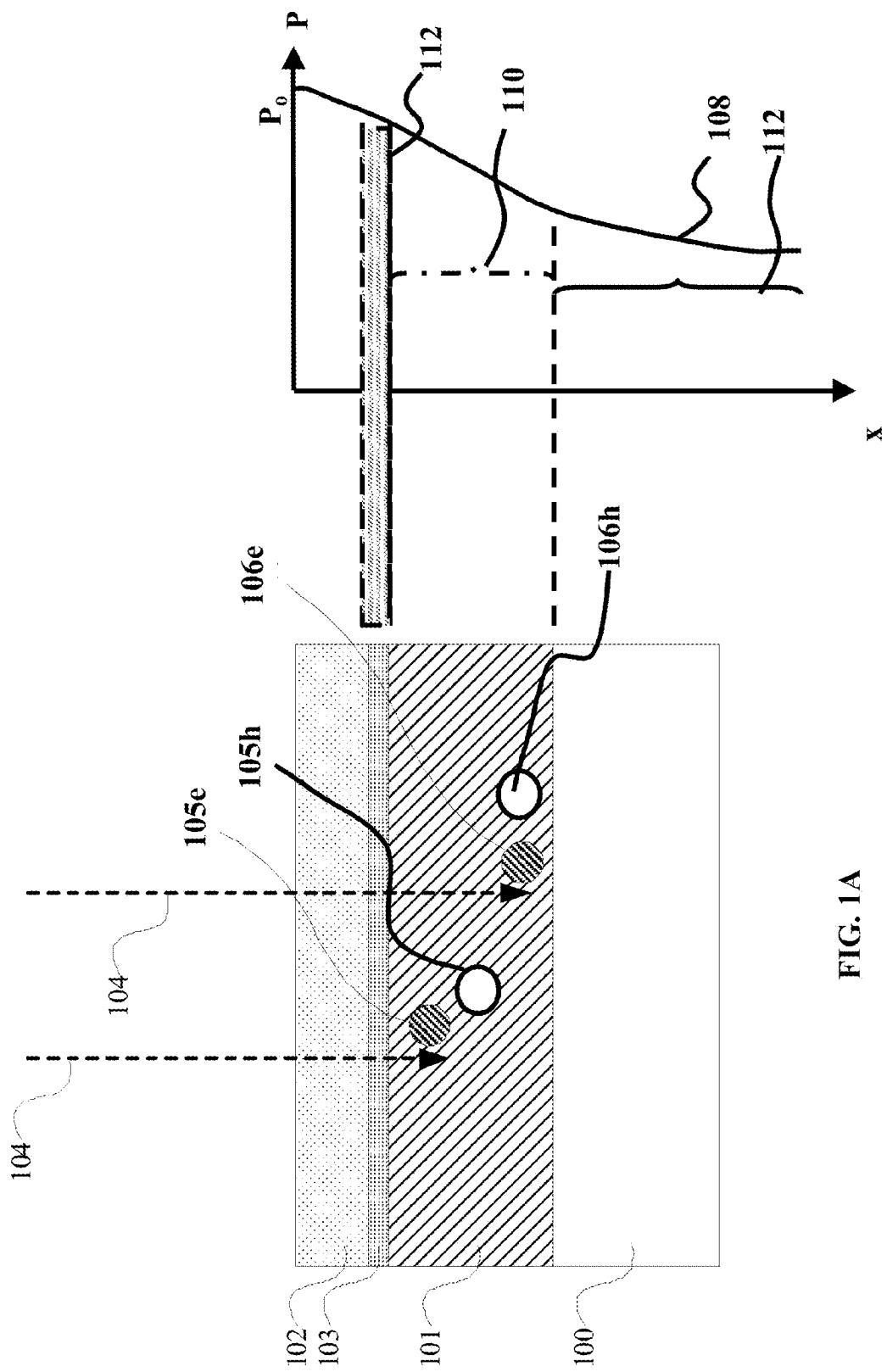
FIG. 1A is a schematic showing the cross-sectional view of a conventional photovoltaic cell structure and FIG. 1B is a schematic showing light penetration as a function of the solar cell depth. This is the explanatory diagram showing the prior-art of today's photovoltaic cell and the light intensity behavior inside semiconductor materials.
Figure 2A:
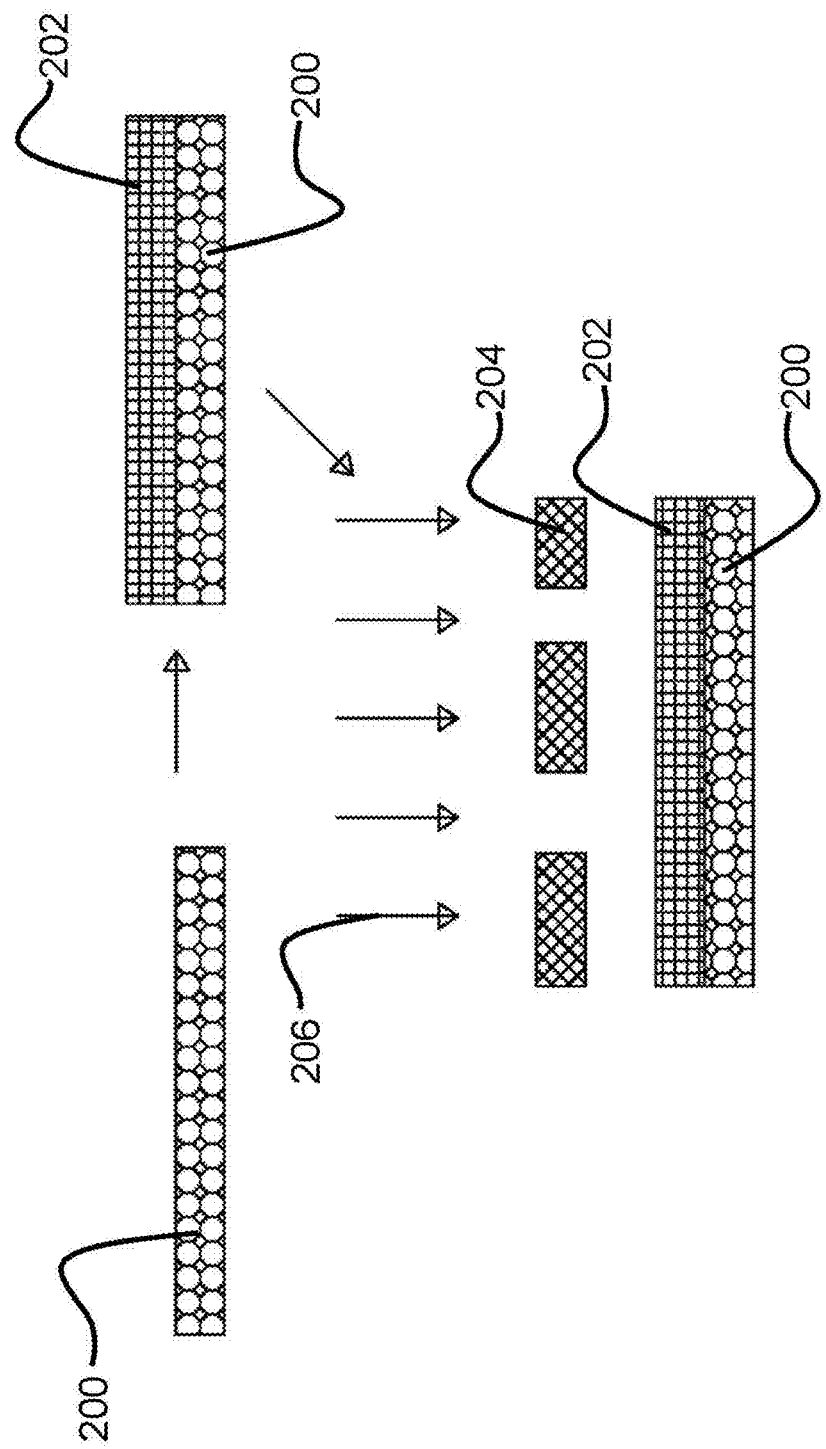
FIGS. 2A and 2B are drawings showing the creation of a mold through use of a plug or buck and photolithography.
Figure 2B:
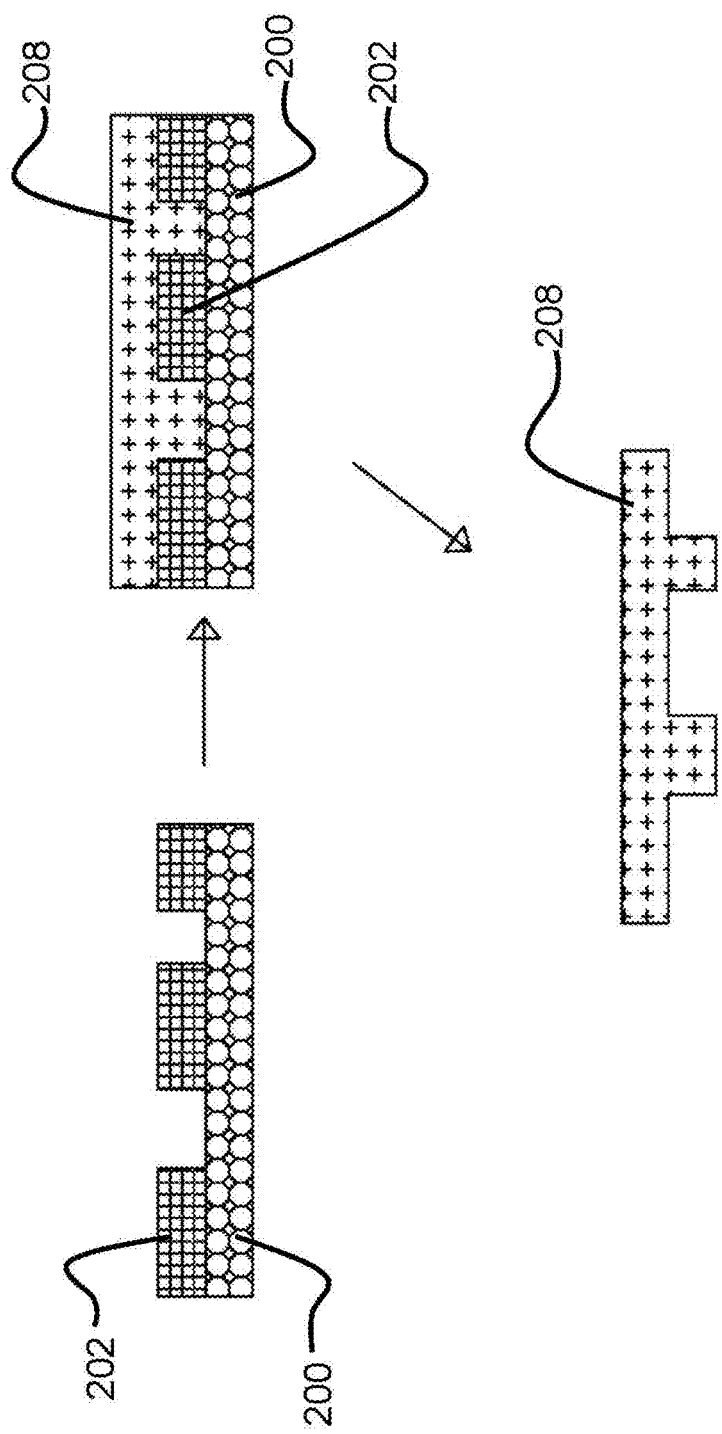

FIGS. 2A-2B. show a fabrication process to create the master mold. A substrate 200 is first covered with a photoresist 202 using the spinning coat technique. Alternatively, photoresist 202 can be also painted on the substrate 200. The photoresist 202 is then covered with a mask 204 that has the desired pattern on it. This photoresist 202 is then exposed to ultraviolet light 206 that is pouring in through the mask 204. The resulting light incident on the photoresist creates the desired photoresist pattern on the surface after subsequent developing process. In this photolithographic process, desired shapes can be created using the standard integrated circuit (IC) process. Following the patterned structure formation, the material is deposited to make the master mold 208 using the newly created pattern. The master mold 208 is then separated from the substrate 200 by etching off the substrate 200 or by using a lift-off process, etc. These materials, again, can be of many different types. The main requirement is that the material of the master mold 208 is hard enough withstand the stamping process when it is finally in use. As an example, not limitation, the material for the master mold 208 can be selected from groups consisting of semiconductor, metal, plastic, and ceramic. As an example, not a limitation, if a material for master mold 208 is metal it can be electroplated or vacuum deposited. Both of these deposition processes will result in the properly formed mold surface. If the material is a semiconductor, etching is necessary following the photoresist 202 pattern to make the master mold 208.

Figure 3A:
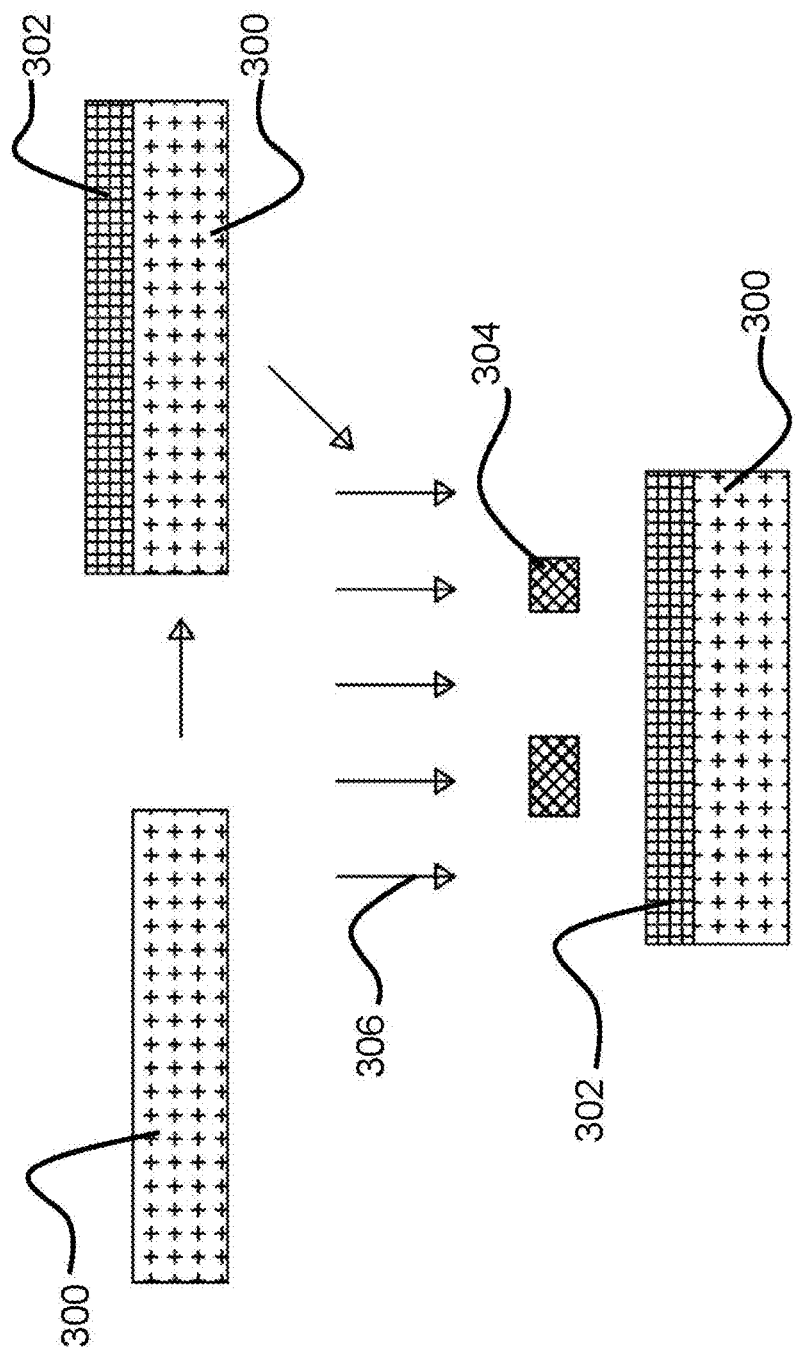
FIGS. 3A and 3B are drawings showing the creation of a mold through the use of an etchant and photolithography.
Figure 3B:
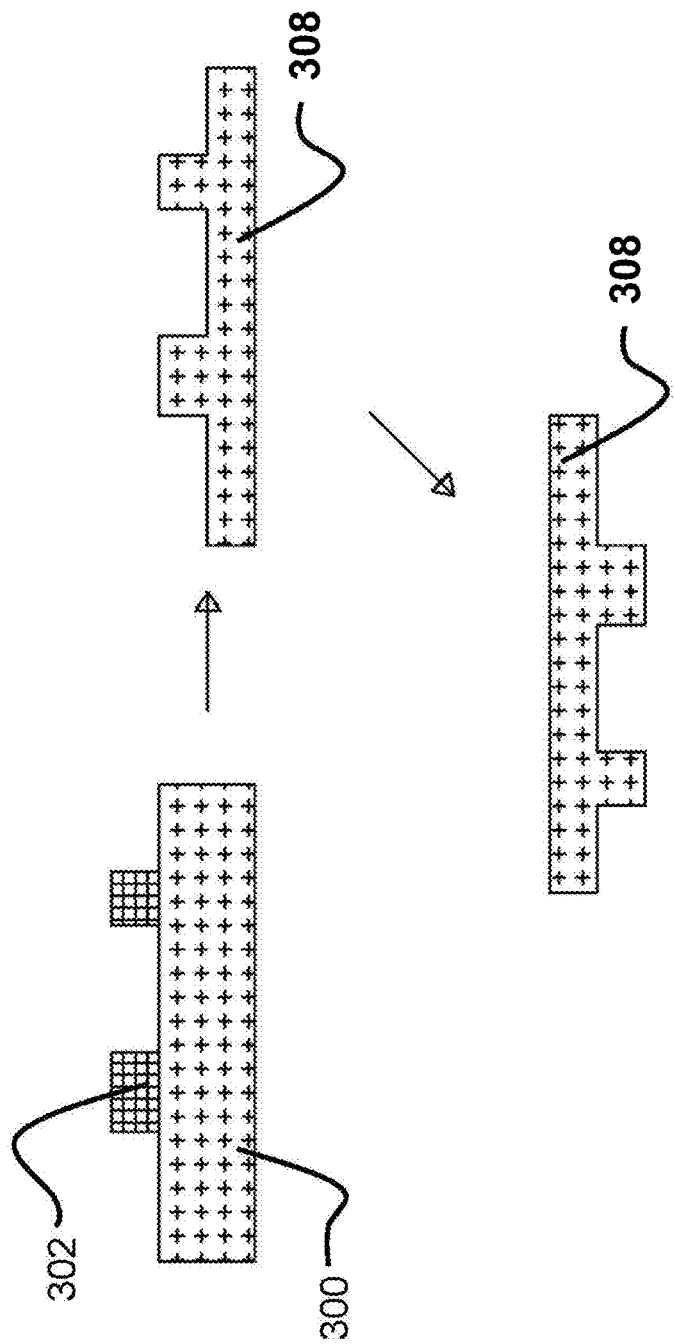

FIGS. 3A-3B. show a mold creation process directly from a mold material. This second process does not involve a plug or buck, but instead directly shapes the master mold from a material 300. As above, the material can be of many different types with the main requirement being the hardness of the material with respect to the material it is stamping. Once the material is selected, in this example it is silicon, the same photolithography process used in FIG. 2, is used. A photoresist 302 is placed on the surface of the base material 300. A negative mask 304 of the desired pattern is then used to filter out the ultraviolet light 306 exposed on the surface. From this exposed mask 304, an appropriate etchant is applied and the photoresist 302 and unprotected material is removed. This creates usable master mold 308 which is used to fabricate the solar cell.

Using the mold for stamping may require the attachment of the thin mold to a press with greater strength and thickness. This is achieved through a direct molecular adhesion without adhesives. The surface of the press and the surface of the mold are both polished to become perfectly level surfaces. The surfaces of the mold and press are brought in contact with each other, and the attractive forces of the atoms on the surface will attract each other with sufficient force to hold the two objects together.

The mold (FIG. 2B, 208 and FIG. 3B, 300) can be made out many types of materials or alloyed materials. The main requirement is that it is hard enough to withstand the stamping process when it is finally in use. By way of example, and not by limitation, carbon or a metal is used (FIG. 2, 208). The substrate that is used for forming the mold, can be made of many different types of materials. Glass, polymers, and semiconductors are examples of these materials and not limitations.

Figure 4A:
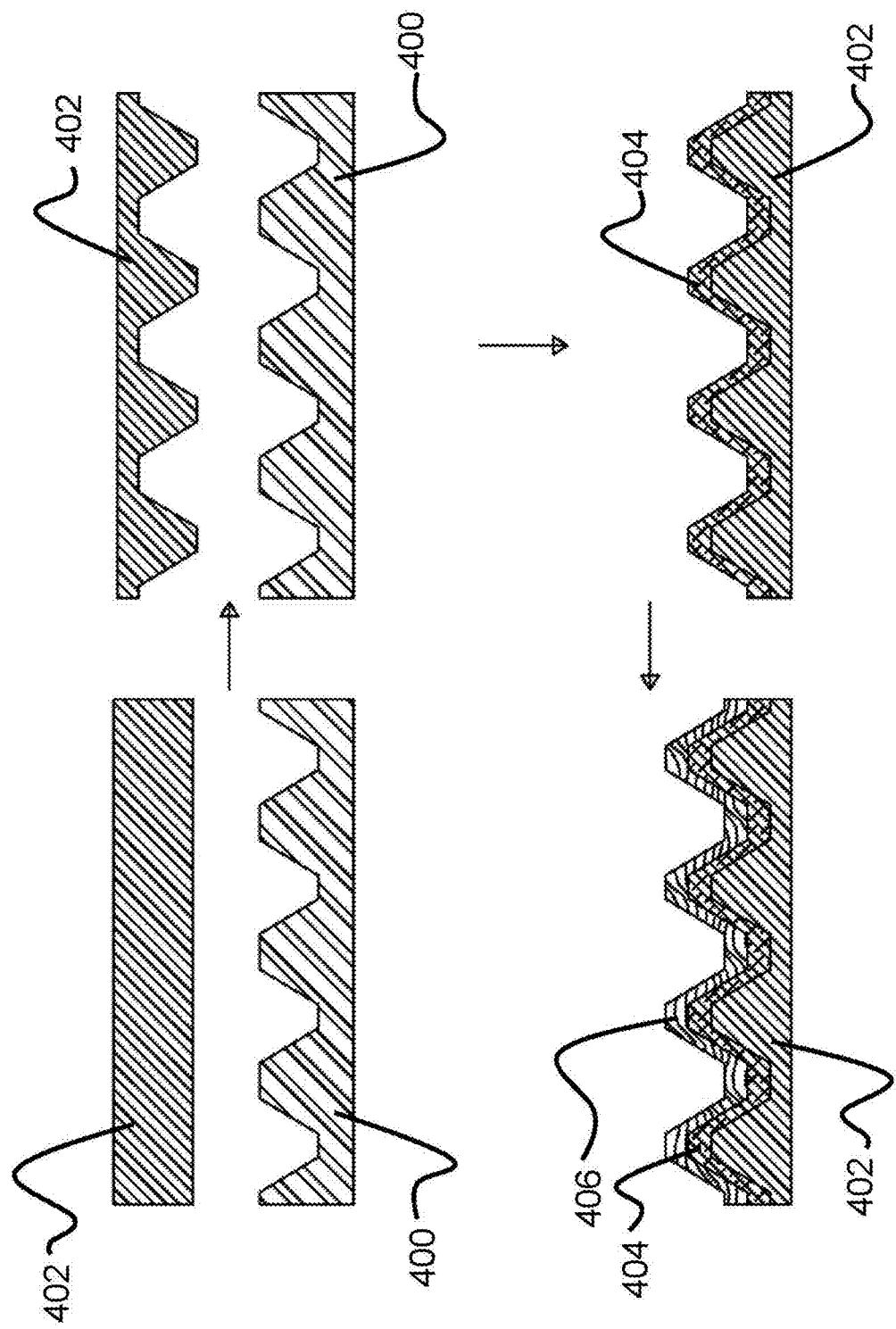
FIG. 4A and FIG. 4B are drawings showing the process of cell creation utilizing an inert substrate.
Figure 4B:
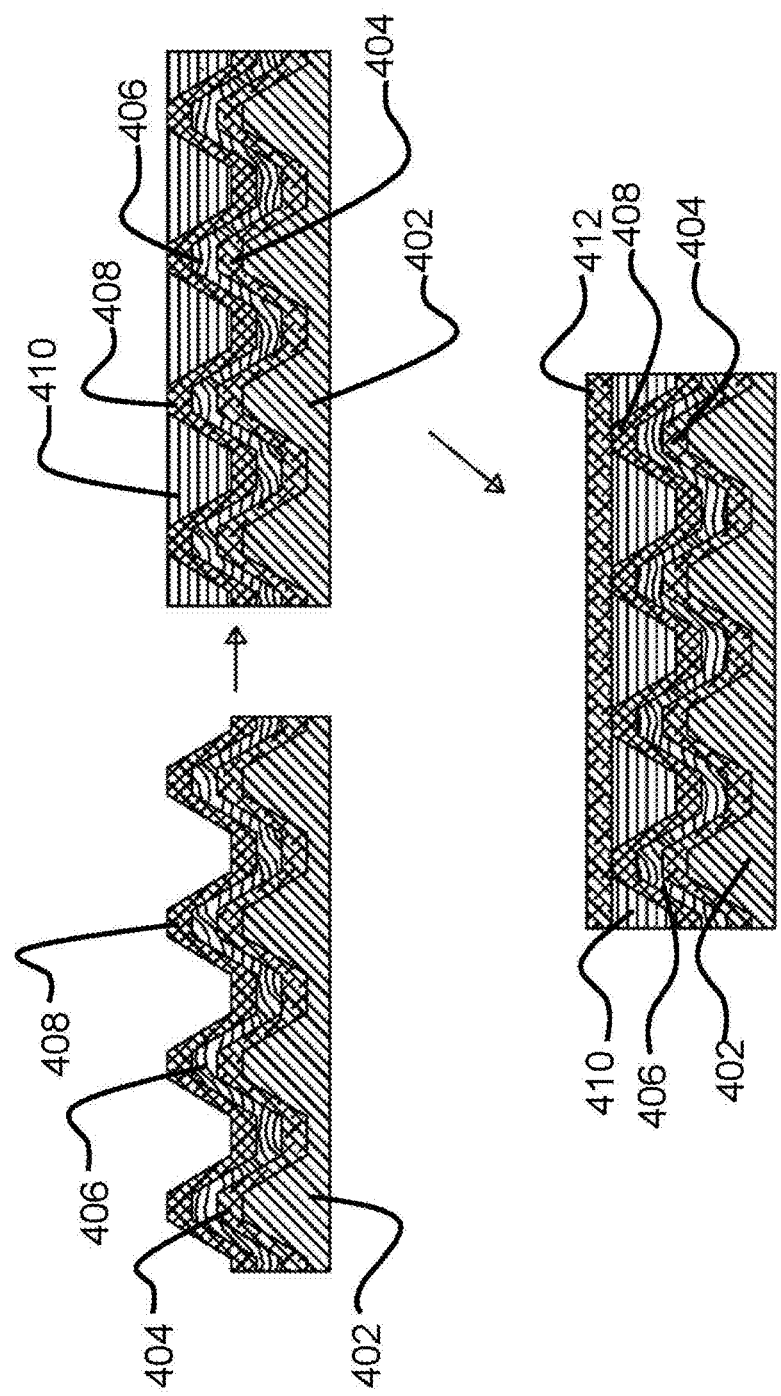

FIGS. 4A-4B. show the patterning process with a dielectric, plastic or other non electrically interactive material 402 as the base of the solar cell. This base is then pressed against a mold 400 to transfer the pattern to the base. Next, a metallic layer, 404 that acts as the electrode of the cell, is deposited on the freshly imprinted base. After that, a first electric layer 406 of p or n type is deposited on top of the freshly deposited metallic layer. This layer forms the first part of the p/n or Schottky junction. The second electric layer 408, see FIG. 4B, of type opposite the first is then joined to the surface of the newly deposited first electric layer 406. This second layer is the second part of the p/n or Schottky junction and must be of a type different from the first. Next, a passivation layer 410 is then deposited over the second electric layer 408 and levels the geometric pattern. Alternatively, this process can be done without the passivation layer. A second metallic layer 412 then caps the structure and acts as the second electrode.

Figure 5A:
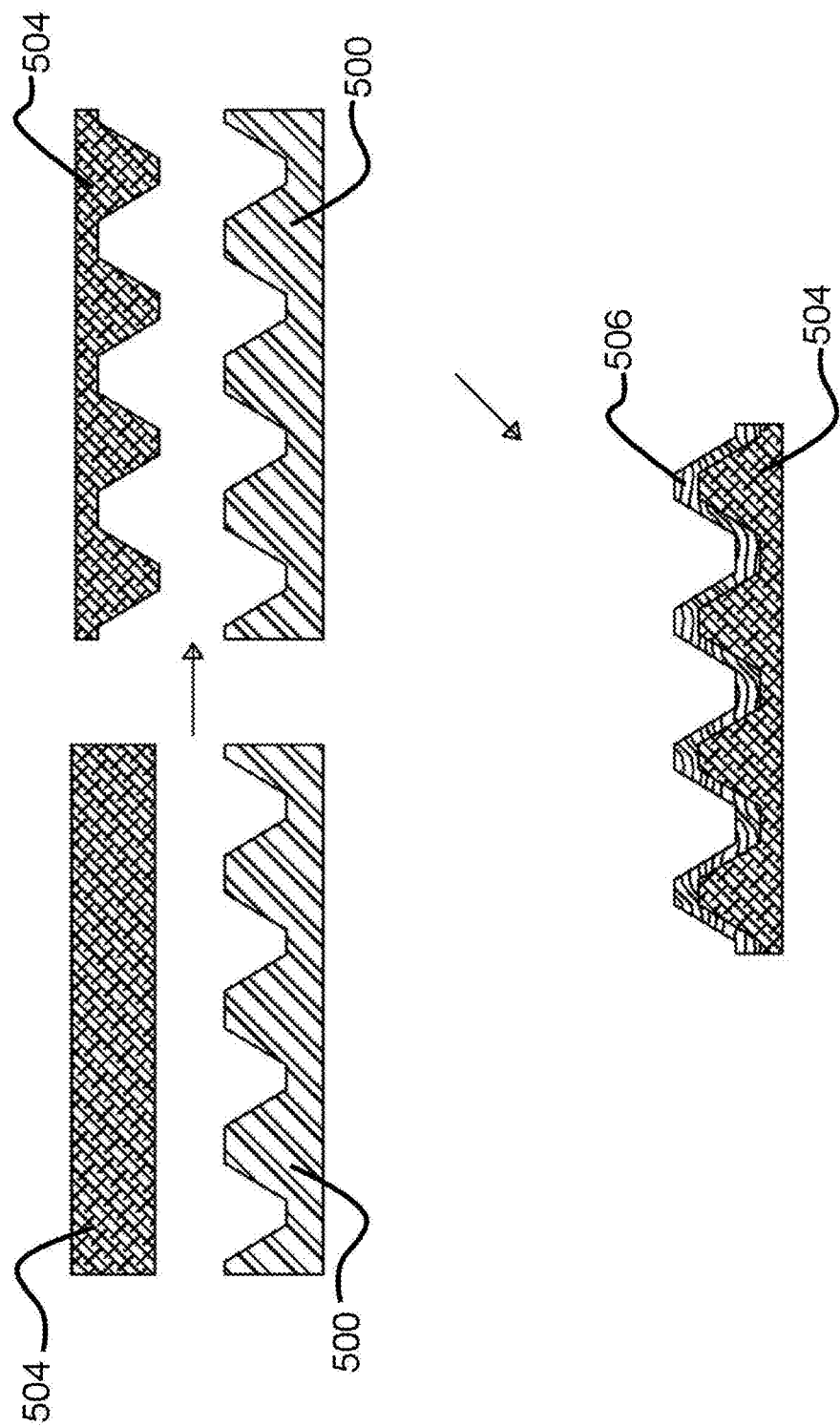
FIGS. 5A and 5B are drawings showing the process of cell creation utilizing a metallic substrate.
Figure 5B:
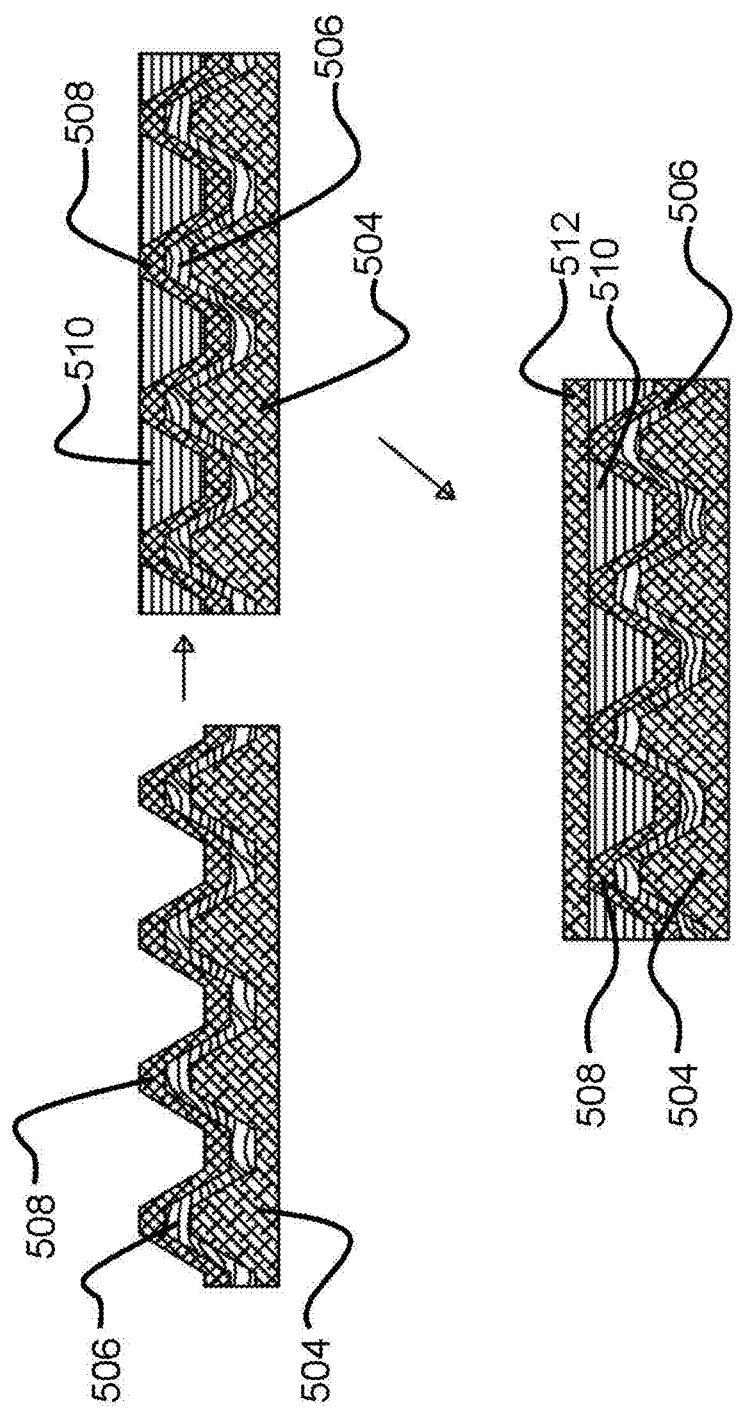

FIGS. 5A-5B. show the patterning process with a metallic material 504 as the base of the solar cell and the electrode. This base is pressed against a negative mold 500 to transfer the pattern to the base. Next, a first electric layer 506 of p or n type is deposited on top of the metallic layer 504. This layer forms the first part of the p/n or Schottky junction. The second electric layer 508 of type opposite the first is then joined to the surface of the newly deposited first electric layer 506. This second electric layer 508 is the second part of the p/n or Schottky junction and must be of a type different from the first. Next, a passivation layer 510 is deposited over the second electric layer 508 and levels the geometric pattern. Alternatively, this process can be done without the passivation layer. A second metallic layer 512 then caps the structure and acts as the second electrode. When using a metal as a base, this process can be done with and without a second layer of metal coating. The metal may be copper, gold, etc.

Figure 6A:
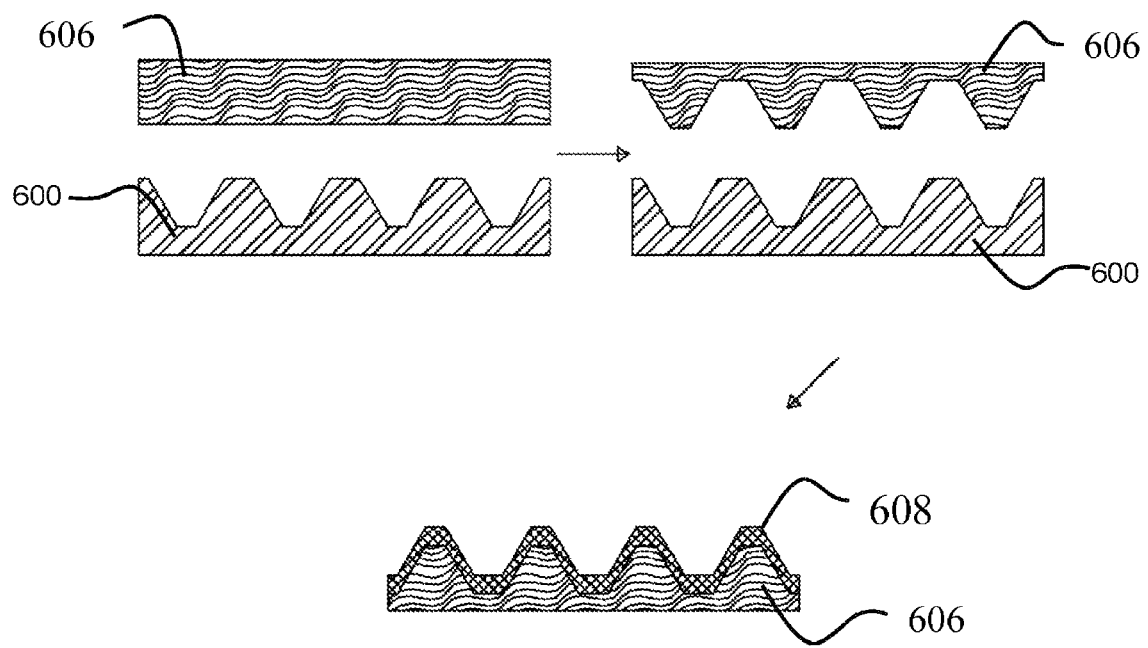
FIGS. 6A and 6B are drawings showing the process of cell creation utilizing an electric substrate.
Figure 6B:
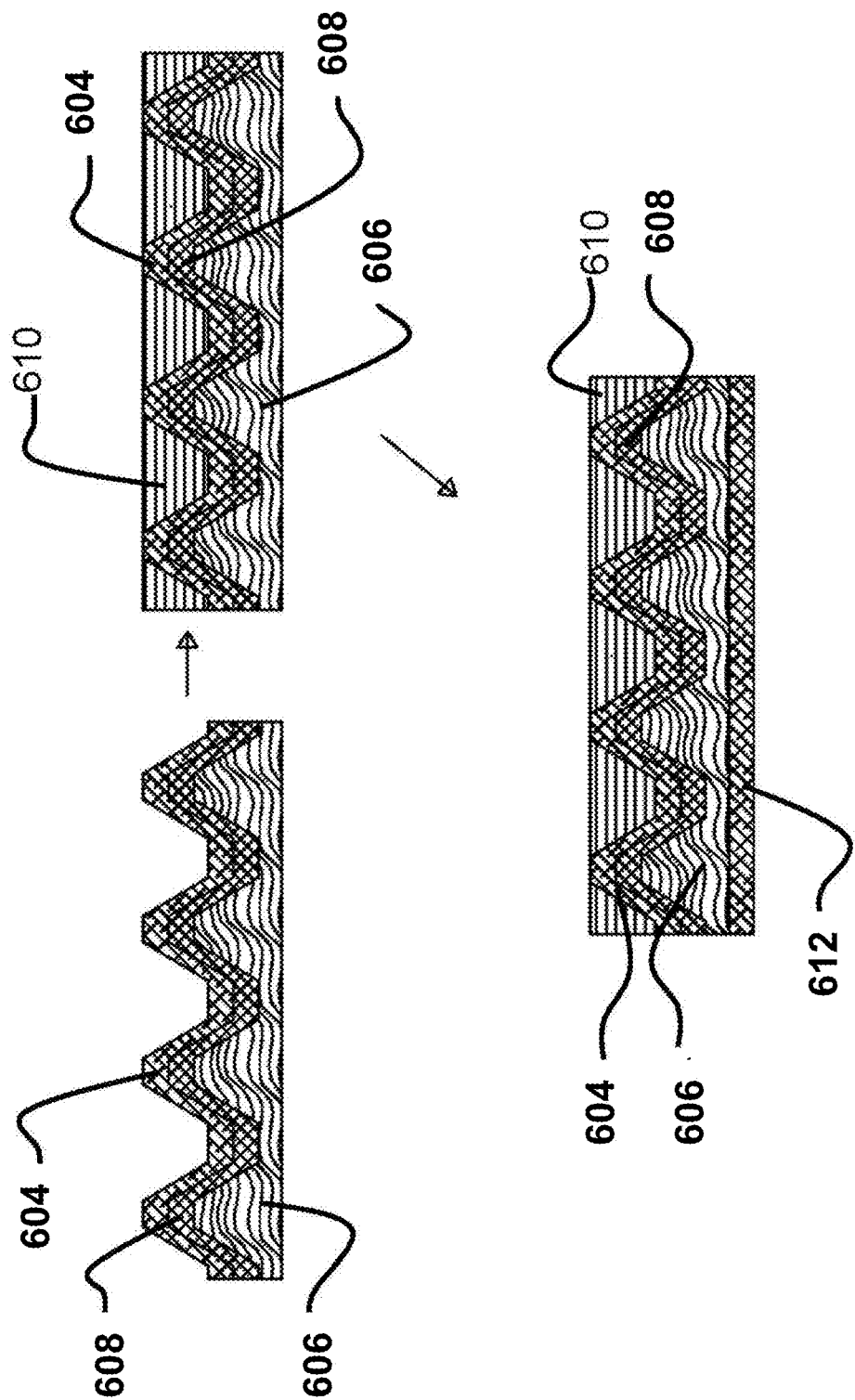

FIGS. 6A-6B. describe the patterning process with a first electric material 606 of p or n type as the base of the solar cell. This layer forms the first part of the p/n or Schottky junction. The base 606 is pressed against a mold 600 to transfer the pattern to the base. Next, a second electric layer 608 of type opposite the first is then joined to the surface of the first electric layer 606. This second layer is the second part of the p/n or Schottky junction and must be of a type different from the first. A first metallic layer 604 is deposited on top of the second electric layer 608. Next, a passivation layer 610 is deposited over the first metallic layer 604 and levels the geometric pattern. Alternatively, this process can be done without the passivation layer. A second metallic layer 612 is then affixed to the bottom of the first electric layer 606. This second metallic layer caps the structure and acts as the second electrode.

Figure 7A:
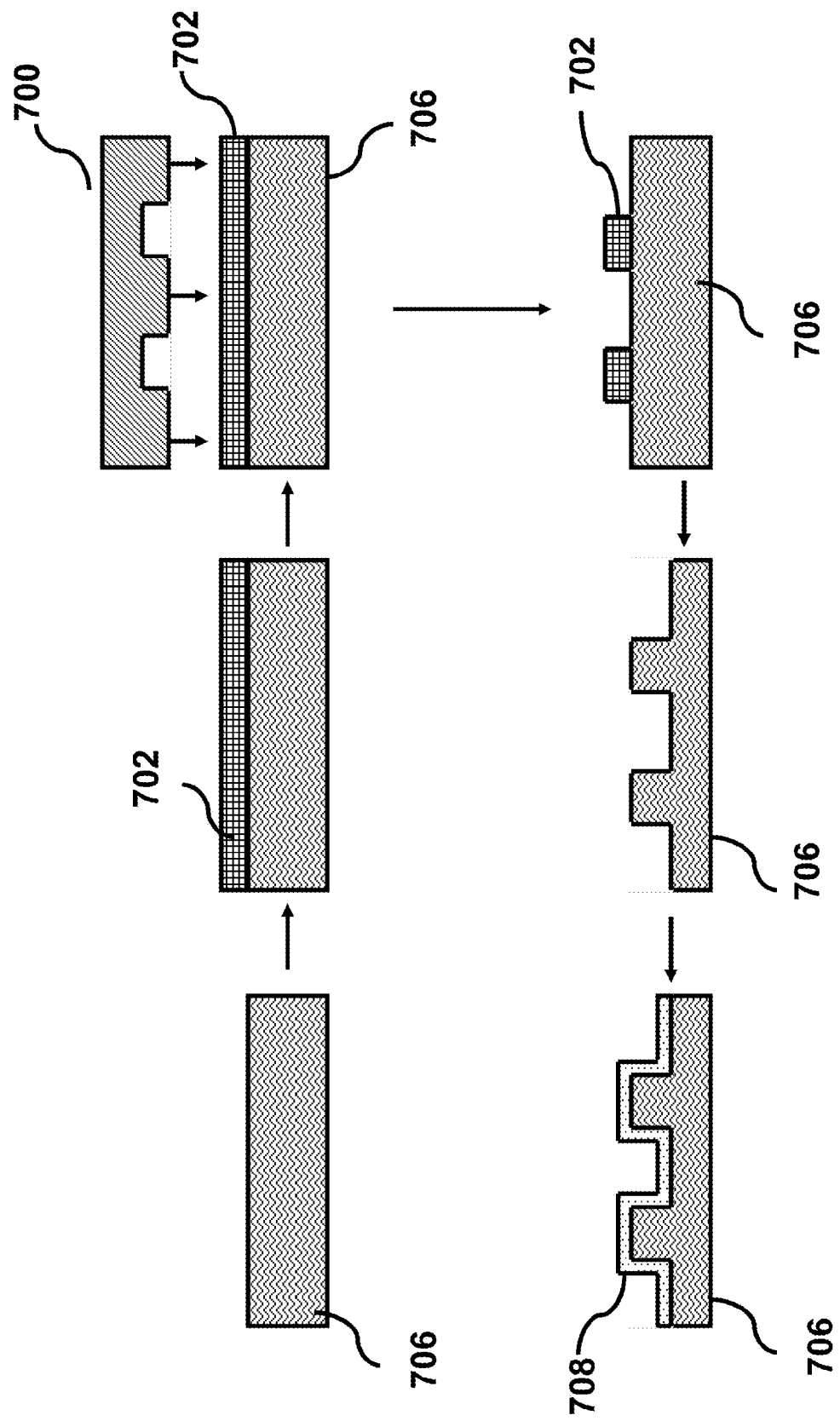
FIGS. 7A and 7B are drawings showing the process of fabricating a solar cell with an electric substrate by using a master mold and photoresist, or photolithography, and etching to create the pattern on the base of the solar cell.
Figure 7B:
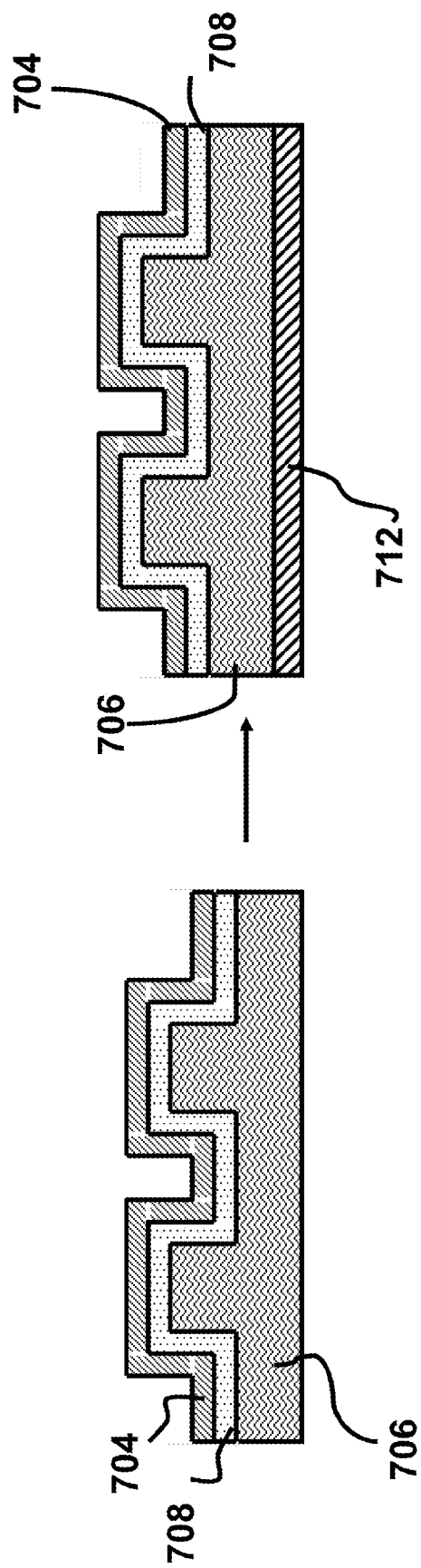

FIGS. 7A and 7B describe the fabrication and patterning of a solar cell through the use of a mold 700 or photolithography. According to this invention, wherein similar numerals represent the similar parts described previously, repeated explanations are omitted herewith. First, a photoresist 702 covers a substrate 706 made from a first electric material, of either p or n type. A master mold 700 stamps the photoresist 702 to create a pattern. Alternatively, standard photolithography or electron beam lithography technique can be used to create the pattern. This is followed by etching of the substrate to make the desired patterns. Dry or wet etching techniques can be used for this purpose. This is followed by the removal of the resist. A second electronic material 708 of type opposite to the first electrical material 706, is then applied. A first metal layer 704 then is deposited on top of the second electronic material 708. A passivation layer, which may or may not be used, can be applied to level the geometric pattern of the solar cell. Next, a second metallic layer 712 is deposited to the bottom of the first electric layer 706 to act as another electrode for the solar cell.

According to these inventions described in FIG. 7, the structure of the solar cell may include trapezoids, cylinders, conical, square, rectangular or pyramids, etc. and can be made of any kind of semiconductor, or compound semiconductor, that has the absorption capability of the desired spectrum region. As an example, not limitation, the structures could be made from Si, Ge, InP, GaAs, CdSe, CdS, CdTe, ZnO, ZnTe, ZnCdTe, CuInSe, CuSe, or InGaAs.

Also according to these inventions, FIGS. 4-6, the supporting substrate and the base of the solar cell (402, 504, 604) can be metal, polymer, ceramic, or semiconductor. The following descriptions of potential materials are to be viewed as examples, and not as limitations. The metal material can be steel, Al, copper, gold, metal foil, etc. The polymer material can be Kapton, etc. The ceramic material can be C, BN, AlN, $Al_2O_3$, Sapphire, glass, etc. The semiconductors may be Si, Ge, InP, GaN, CdTe, Pbs, GaAs, ZnO, SiGe, CuInSe, or the groups II-VI and III-V etc.)

The solar cell is comprised of a first and second metallic layer, such as copper, gold, etc. For example, not limitation, the first metallic layer could be metallic substrate (e.g. steel or copper) and the second metallic layer is deposited onto the first metallic substrate to act as an electrode.

According to this invention, the solar cell is further comprised of two layers of electronic material. This material could be II-V based materials (n or p type). For example, CdTe, CdZnS (p or n type, opposite to CdTe) or Zn(Cd)Te/ZnS based materials could be used. This electronic material could be any type of electronics materials including semiconductors, insulators, or metal materials. For way of example, and not limitation, the material could be a semiconductor such as Si, Ge, a compound semiconductor from III-V or II-VI groups, InP, GaAs, GaN III-V, CdTe, CdS, Cdse, ZnS, or ZnSe.

One of the final steps in the solar cell formation involves leveling the geometric pattern with a passivation layer. The passivation layer may be formed on the second electric material before forming the first/second metallic layer. Alternatively, the passivation layer may be formed on the first/second metallic layer. This layer, as an example and not a limitation, could be silicon oxide or a polymer.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiment for complete and clear disclosure, the appended claims are not to be thus limited but are to be construed as embodying all modification and alternative constructions that may occur to one skilled in the art which fairly fall within the basic teaching set forth here.

The present invention is expected to be found practical for the creation of photovoltaic cells with significantly high conversion efficiencies. These cells also have a higher power generation capability as compared with that of their conventional counterparts. The proposed invention can be used for fabricating wide solar panels for both commercial space, and other applications.

What is claimed is:

1. A method of fabricating a photovoltaic cell comprising:
   forming a mold having a pattern, wherein said pattern has shapes selected from the group consisting of a pyramid, a cone, a cylinder, and a trapezoidal pyramid, and wherein said mold is formed from a hard and rigid material which is selected from the group consisting of carbon, semiconductor, metal and ceramic;
   covering a base with a resist layer, wherein the base is a first electric material of either p or n type;
   stamping the mold onto the resist layer to transfer the pattern to the resist layer, thereby creating first regions without said resist layer and second regions with said resist layer, wherein the first regions without said resist layer expose part of said base and the second regions with said resist layer cover part of said base;
   etching the parts of said base which are exposed by said first region without the resist layer;

removing the resist layer;

depositing a layer of second electric material on the base in a manner that preserves the pattern on the layer of second electric material, wherein the second electric material is of type opposite to the first electric material, thereby forming a p-n junction;

depositing a first metal layer on the layer of second electric material to form a first electrode;

depositing a second metal layer under the base to form a second electrode, and;

forming a passivation layer on said first metal layer, such that said passivation layer forms a flat surface.

2. The method of claim 1, wherein said forming a mold comprises:

covering a substrate with a photoresist;

covering the photoresist with a mask having the pattern;

exposing the photoresist to ultraviolet light through the mask;

developing the photoresist to create the pattern on the photoresist;

depositing mold material onto the pattern to form the mold having the pattern out of the mold material; and separating the mold from the substrate.

3. The method of claim 1, wherein said passivation layer is formed from Silicon Oxide or Polymer.

4. The method of fabricating a photovoltaic cell of claim 1, wherein said first electric material or said second electric material is selected from a group consisting of Si, Ge, SiGe, InP, GaAs, InGaAs, GaN, CdTe, CdS, CdSe, CdZnS, ZnS, ZnTe, ZnCdTe, ZnO, CuSe, CuInSe, PbS, and ZnSe, and their combination thereof.

5. The method of fabricating a photovoltaic cell of claim 1, wherein said first metal layer or said second metal layer is selected from a group consisting of Steel, Al, Copper, Gold, and metal foil.

6. The method of fabricating a photovoltaic cell of claim 1, wherein said ceramic is selected from a group consisting of BN, AlN, $Al_2O_3$, Sapphire, and Glass.

* * * * *